United States Patent
Seto

(10) Patent No.: US 6,642,719 B1
(45) Date of Patent: Nov. 4, 2003

(54) DEVICE FOR JUDGING LIFE OF AUXILIARY BATTERY

(75) Inventor: Hitoshi Seto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/031,116

(22) PCT Filed: Jun. 8, 2000

(86) PCT No.: PCT/JP00/03733
§ 371 (c)(1),
(2), (4) Date: Jan. 16, 2002

(87) PCT Pub. No.: WO01/94962
PCT Pub. Date: Dec. 13, 2001

(51) Int. Cl.$^7$ .......................... G01N 27/416; H02J 7/00
(52) U.S. Cl. ........................ 324/427; 320/132
(58) Field of Search ................ 320/132, 104, 320/149, DIG. 21; 324/427, 426, 433, 434; 340/636

(56) References Cited

U.S. PATENT DOCUMENTS 6,160,380 A * 12/2000 Tsuji et al. .................. 320/132
6,232,747 B1 * 5/2001 Takahashi et al. .......... 324/427

FOREIGN PATENT DOCUMENTS

| JP | 60-95371 | 5/1985 |
| JP | 10-153647 | 6/1998 |
| JP | 11-271407 | 10/1999 |

* cited by examiner

Primary Examiner—Edward H. Tso
Assistant Examiner—Pia Tibbits
(74) Attorney, Agent, or Firm—Sughrue Mion, PLLC

(57) ABSTRACT

The depth of discharge of an auxiliary battery 6 is calculated, and the lifetime of the auxiliary battery 6 is determined based on the discharge. characteristic of the calculated one of different depths of discharge.

9 Claims, 2 Drawing Sheets

(a) DEPTH OF DISCHARGE X%

(b) DEPTH OF DISCHARGE Y%

(a)

(b)

DEVICE FOR JUDGING LIFE OF AUXILIARY BATTERY

TECHNICAL FIELD

The present invention relates to an auxiliary battery life determining device that determines the life of an auxiliary battery for use in case of emergency.

BACKGROUND ART

An emergency reporting system or the like may sometimes be loaded with an auxiliary battery, in addition to a main battery (a lead-acid battery) for normal operation, so as to exclude the possibility of the system becoming inoperative in emergencies.

However, the auxiliary battery for emergency use is also exhausted by spontaneous discharge, and hence in some cases it cannot be used even if switched from the main battery in an emergency.

Incidentally, there have been proposed devices for detecting or indicating the amount of power remaining in a secondary battery; for example, Pat. Pub. Gazette No. 10-153647 adopts a scheme that compares the output voltages from the secondary battery under no-load conditions and under load conditions, and uses the difference to detect the remaining battery power, but no proposal has been made of a device of the type that refers to discharge curves different according to the depth of discharge and detects and indicates the remaining battery power.

With the conventional battery life determining devices described above, since the difference between the output voltages under no-load and load conditions with different depths of discharge cannot accurately be detected due to different discharge characteristics, the lifetime of the auxiliary battery cannot be detected—this makes it impossible to avoid the possibility that the auxiliary battery cannot be used in case of emergency.

The present invention is intended to solve the above-mentioned problem, and has for its object to provide an auxiliary battery life determining device that permits accurate detection of the service life of the auxiliary battery.

DISCLOSURE OF THE INVENTION

An auxiliary battery life determining device according to a first aspect of the present invention is adapted to measure the terminal voltage and temperature of an auxiliary battery, calculate the depth of discharge of the auxiliary battery from the measured results and determine the useful life of the auxiliary battery.

This allows detection of the auxiliary battery life, making it possible to preclude the possibility that the auxiliary battery cannot be used in case of emergency.

According to another aspect of the present invention, the auxiliary battery determining device is adapted to indicate that the auxiliary battery needs replacing when the depth of discharge of the auxiliary battery exceeds a reference depth of discharge.

This ensures replacement of the auxiliary battery before the auxiliary battery cannot be used.

According to another aspect of the present invention, the auxiliary battery life determining device is adapted to refer to discharge curves of different depths of discharge, calculate the amount of power remaining in the auxiliary battery from the measured results by the measuring means and indicate the calculated remaining power of the auxiliary battery.

This permits accurate detection of the life of the auxiliary battery.

According to another aspect of the present invention, the auxiliary battery life determining device is adapted to refer to discharge curves of different depths of discharge, calculate the useful time of the auxiliary battery from the measured results by the measuring means and indicate the calculated useful time of the auxiliary battery.

This permits accurate detection of the timing for replacement of the auxiliary battery.

According to another aspect of the present invention, the auxiliary battery life determining device is adapted to periodically cause a discharge of a constant current until the number of times the constant current is discharged reached a predetermined number of times.

This permits detection of the self discharge ratio of the auxiliary battery and the number of times the constant current is discharged therefrom, enabling its useful time to be calculated by a microcomputer or the like and hence the lifetime of the auxiliary battery to be detected.

According to another aspect of the present invention, the auxiliary battery life determining device is adapted to measure the discharge current terminal voltage and temperature of the auxiliary battery when connected to a dummy load, calculate the depth of discharge of the auxiliary battery from the measured results and decide the lifetime of the auxiliary battery based on the calculated depth of discharge.

This allows detection of the auxiliary battery life, making it possible to preclude the possibility that the auxiliary battery cannot be used in case of emergency.

According to another aspect of the present invention, the auxiliary battery life determining device is adapted to indicate that the auxiliary battery needs replacing when the depth of discharge of the auxiliary battery when connected to a real load exceeds a reference depth of discharge.

This ensures replacement of the auxiliary battery before the auxiliary battery cannot be used.

According to another aspect of the present invention, the auxiliary battery life determining device is adapted to refer to discharge curves of different depths of discharge, calculate the amount of power remaining in the auxiliary battery connected to the real load from the measured results by the measuring means and indicate the calculated remaining power of the auxiliary battery.

This permits accurate detection of the life of the auxiliary battery.

According to another aspect of the present invention, the auxiliary battery life determining device is adapted to refer to discharge curves of different depths of discharge, calculate the useful time of the auxiliary battery connected to the real load from the measured results by the measuring means and indicate the calculated useful time of the auxiliary battery.

This permits accurate detection of the timing for replacement of the auxiliary battery.

BEST MODE FOR CARRYING OUT THE INVENTION

To facilitate a better understanding of the present invention, a description will be given, with reference to the accompanying drawings, of the best mode for carrying out invention.

Embodiment 1

Figure 1:
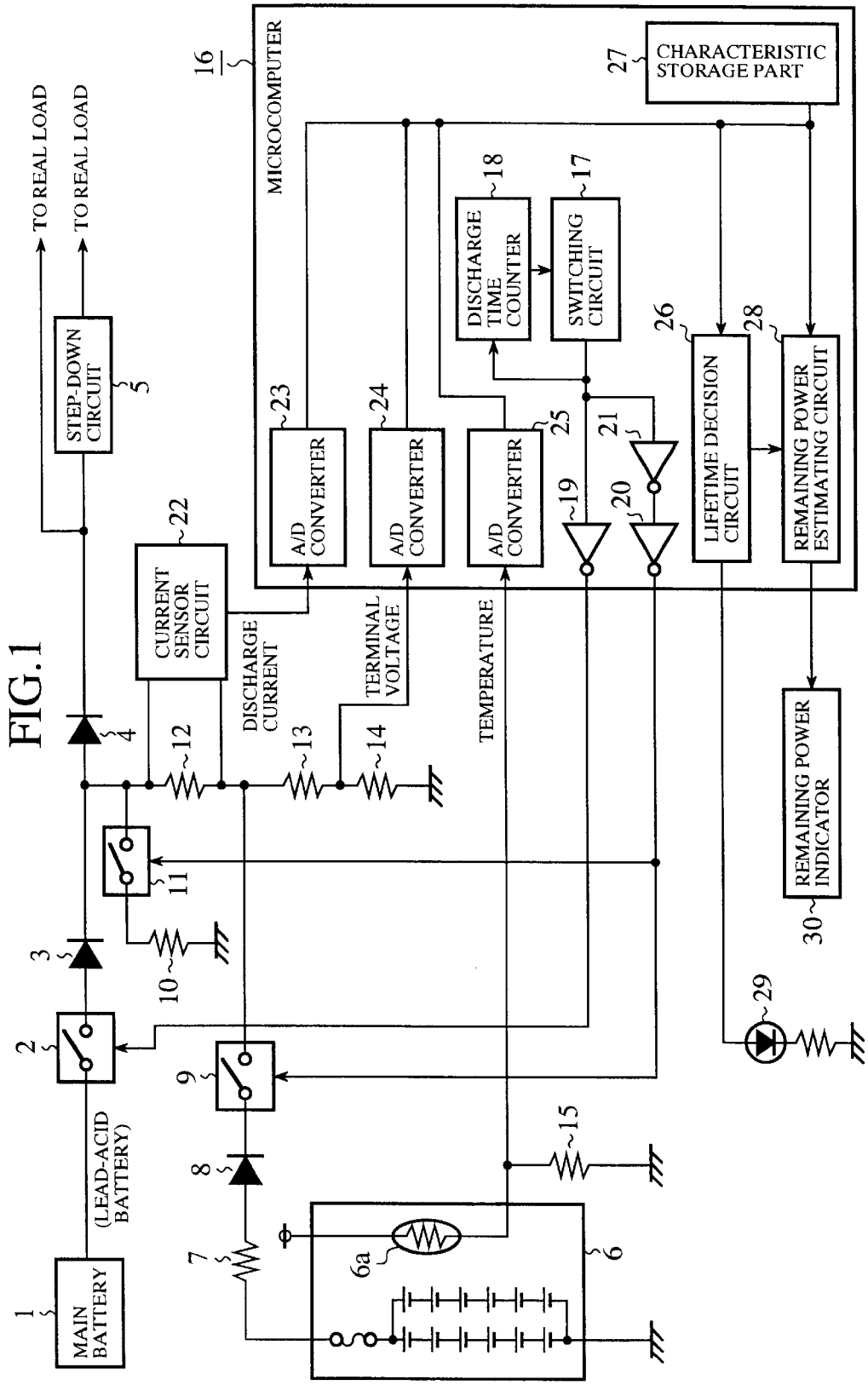
FIG. 1 is a block diagram illustrating an auxiliary battery life determining device according to Embodiment 1.

FIG. 1 illustrates in block form an auxiliary battery life determining device according to Embodiment 1 of the present invention. In FIG. 1, reference numeral 1 denotes a main battery (a lead-acid battery); 2 denotes a switch; 3 and 4 denote reverse blocking diodes; 5 denotes a step-down circuit; 6 denotes an auxiliary battery that has a thermistor 6a, such as a lithium battery; 7 denotes a guard resistor; 8 denotes a reverse blocking diode; 9 denotes a switch; 10 denotes a dummy load; 11 denotes a switch; and 12 to 15 denote resistors.

Reference numeral 16 denotes a microcomputer; 17 denotes a switching circuit which, at the time of determining the lifetime of the auxiliary battery 6, turns ON the switches 9 and 11 (OFF the switch 2) to discharge a constant current from the auxiliary battery 6 to the dummy load 10; 18 denotes a discharge time counter for measuring the time of discharge from the auxiliary battery; and 19 to 21 denote delay elements (inverter circuits). Incidentally, the switches 2, 9 and 11, the switching circuit 17, the discharge time counter 18 and the delay elements 19 to 21 constitute discharge means.

Reference numeral 22 denotes a current sensor circuit formed by a voltage-current converter and an amplifier, for measuring the discharge current from the auxiliary battery 6; 23 denotes an A/D converter for A/D converting the discharge current from the auxiliary battery 6 measured by the current sensor circuit 22; 24 denotes an A/D converter for A/D converting the terminal voltage of the auxiliary battery 6; and 25 denotes an A/D converter for A/D converting the temperature of the auxiliary battery 6. Incidentally, the thermistor 6a, the resistors 12 to 15, the current sensor circuit 22 and the A/D converters 23 to 25 constitute measuring means.

Reference numeral 26 denotes a lifetime decision circuit which calculates the depth of discharge of the auxiliary battery 6 from the results of conversions by the A/D converters and, when the depth of discharge exceeds a reference depth, turns ON a replacement timing indication LED 29; 27 denotes a characteristic storage part for storing discharge curves (discharge characteristics) of different depths of discharge; 28 denotes a remaining power estimating circuit which estimates the amount of power remaining in the auxiliary battery 6 from the results of conversion by the A/D converters 23 to 25; 29 denotes the replacement timing indication LED; and 30 denotes a remaining power indicator for indicating the remaining power of the auxiliary battery 6. Incidentally, the lifetime decision circuit 26, the characteristic storage part 27, the remaining power estimating circuit 28, the replacement timing indication LED 29 and the remaining power indicator 30 constitute decision means.

Next, the operation of the above embodiment will be described below.

When the amount of power remaining in the main battery 1 is sufficient and no failures are found, the switch 2 is kept ON (the switches 9 and 11 OFF), providing therethrough a power supply from the main battery 1 to a real load.

However, upon occurrence of an emergency such as a voltage drop or cutoff of the main battery 1, the switching circuit 17 turns OFF the switch 2 and ON the switch 9 (OFF the switch 11), through which power is supplied from the auxiliary battery 6 to the real load.

With such an arrangement, even if the use of the main battery 1 becomes impossible, the power supply from the auxiliary battery 6 to the real load excludes the possibility of the system becoming inoperative in emergencies.

However, since the auxiliary battery 6 normally out of use is also exhausted by self-discharge, it cannot be used in some instances even if switched from the main battery 1 in case of emergency.

To avoid this, Embodiment 1 examines the life of the auxiliary battery 6 by periodically calculating he depth of discharge of the auxiliary battery 6.

To examine the lifetime of the auxiliary battery 6, the switching circuit 17 first turns OFF the switch 2, and until a predetermined discharge time elapses (for instance, 10 mS), it holds the switches 9 and 22 in the ON state, discharging therethrough a constant current (for example, a 5-A current) from the auxiliary battery 6 to the dummy load 10.

The lifetime decision circuit 26 calculates, upon the start of discharge from the auxiliary battery 6, the depth of discharge of the auxiliary battery 6 from the results of conversion (the discharge current, terminal voltage and temperature of the auxiliary battery 6) by the A/D converters 23 to 25.

And, when the depth of discharge of the auxiliary battery 6 exceeds a reference depth of discharge (for example, when the reference depth of discharge assumed to be 10% is exceeded), the lifetime decision circuit 26 decides that the auxiliary battery 6 needs replacing (if it decides that no current is discharged to the real load for the minimum guaranteed time of operation (10 minutes, for instance)), and turns ON the replacement timing indication LED 29.

Now, assuming that the discharge time is 10 mS, the discharge current is 5 A and the nominal rate capacitance of the auxiliary battery 6 is 2200 mAh, the depth of discharge per discharge to the dummy load is only 5 A×10 mS=2200 mAh=$6.3 \times 10^{-4}$% (In this case, the terminal voltage and temperature of the auxiliary battery 6 are omitted for the sake of clarity, but this does not make much difference to the depth of discharge).

Hence, the discharge to the dummy load can be done 158400 times until the 10% reference depth of discharge is reached; assuming that the service life of the auxiliary battery 6 is five years, the discharge to the dummy load can be done 8.6 times per day. This means that the discharge to the dummy load is carried out every three hours, and this time interval affects the lifetime decision accuracy.

Figure 2:
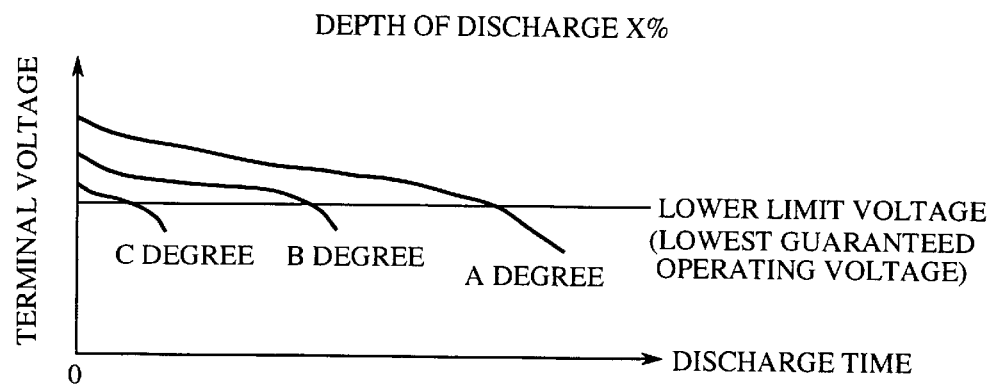
FIG. 2 is explanatory of discharge curves (discharge characteristics) of different depths of discharge.
Figure 2:
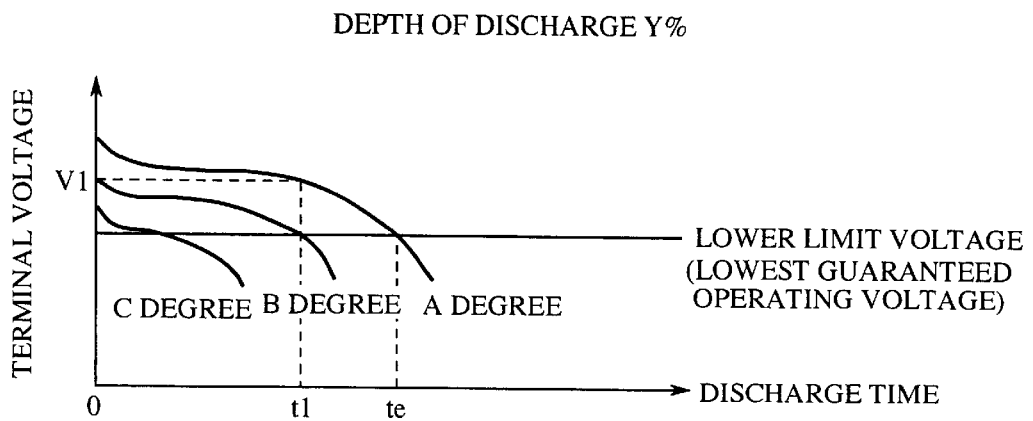

Upon calculation of the depth of discharge of the auxiliary battery 6 by the lifetime decision circuit 26, the remaining power estimating circuit 28 refers to the discharge curves of different depths of discharge (see FIG. 2: It must be noted here, in particular, that the discharge characteristic (the discharge time) becomes worse with an increase in the depth of discharge), then estimates the amount of power remaining in the auxiliary battery 6 from the results of conversion (the discharge current, terminal voltage and temperature of the auxiliary battery 6) by the A/D converters 23 to 25, and indicates on the remaining power indicator 30 the estimated amount of power remaining in the auxiliary battery 6.

For example, when the depth of discharge is Y % (where depth of discharge X<Y %) and the temperature of the auxiliary battery 6 is A degree, reference is made to the discharge curve of temperature A in FIG. 2(*b*).

Assuming that the current terminal voltage is V1, the discharge time of the auxiliary battery 6 is t1 and the dischargeable time of the auxiliary battery 6 is te; hence, the remaining power estimating circuit calculates and displays the remaining power, F %=(te−t1)/te, of the auxiliary battery 6.

Upon expiration of the predetermined discharge time, the switching circuit 17 returns the switch 2 to the ON state and the switches 9 and 11 to the OFF state, providing a power supply from the main battery 1 to the real load.

As will be seen from the above, Embodiment 1 is adapted to calculate the depth of discharge of the auxiliary battery 6 and determine the lifetime of the auxiliary battery 6 based on the calculated depth of discharge, and hence it permits determination of the replacement timing of the auxiliary battery 6 and the remaining power thereof. This ensures replacement of the auxiliary battery 6 and hence excludes the possibility of the system becoming inoperative in emergencies.

Embodiment 2

While in Embodiment 1 the remaining power estimating circuit 28 has been described to indicate the remaining power of the auxiliary battery 6, provision may also be made for the remaining power estimating circuit 28 to indicate the useful time, T=te−tl, of the auxiliary battery 6, in which case, too, the same results as obtainable with Embodiment 1 could be obtained.

Embodiment 3

While Embodiments 1 and 2 have been described to periodically connect the auxiliary battery 6 to the dummy load 10 for discharge thereto, it is also possible to employ a construction in which when the auxiliary battery 6 is supplying power to the real load (with the switch 2 held OFF and the switch 9 ON and the switch 11 OFF) in the event of a failure or disconnection of the main battery 1, the lifetime decision circuit 26 calculates the depth of discharge of the auxiliary battery 6 as in Embodiment 1 to thereby indicate the replacement timing, remaining power or useful time of the auxiliary battery 6.

INDUSTRIAL APPLICABILITY

As described above, the auxiliary battery life determining device according to the present invention is suitable for use in an emergency reporting system or the like which employs, in addition to a main battery for normal use, an auxiliary battery for use in emergencies.

What is claimed is:

1. An auxiliary battery life determining device comprising: discharge means for connecting an auxiliary battery to a dummy load to discharge a constant current from said auxiliary battery to said dummy load; measuring means for measuring the terminal voltage and temperature of said auxiliary battery when said discharge means causes the discharge of the constant current; and decision means for calculating the depth of discharge of said auxiliary battery from the measured results by said measuring means and for deciding the lifetime of said auxiliary battery based on said calculated depth of discharge,
wherein said decision means refers to discharge curves of different depths of discharge, then calculates the amount of power remaining in said auxiliary battery from the measured results by said measuring means.

2. The auxiliary battery life determining device according to claim 1, wherein said decision means displays said auxiliary battery needs replacing when the depth of discharge of said auxiliary battery exceeds a reference depth of discharge.

3. The auxiliary battery life determining device according to claim 1, wherein said decision means displays the amount of power remaining in said auxiliary battery.

4. The auxiliary battery life determining device according to claim 1, wherein said decision means refers to discharge curves of different depths of discharge, then calculates the useful time of said auxiliary battery from the measured results by said measuring means, and displays the useful time of said auxiliary battery.

5. The auxiliary battery life determining device according to claim 1, wherein said discharge means periodically causes the discharge of the constant current until the number of times the constant current is discharged reaches a predetermined number of times.

6. An auxiliary battery life determining device comprising: measuring means for measuring the discharge current, terminal voltage and temperature of an auxiliary battery connected to a real load; and decision means for calculating the depth of discharge of said auxiliary battery from the measured results by said measuring means and for deciding the lifetime of said auxiliary battery based on said calculated depth of discharge,
wherein said decision means refers to discharge curves of different depths of discharge, then calculates the amount of power remaining in said auxiliary battery from the measured results by said measuring means.

7. The auxiliary battery life determining device according to claim 6, wherein said decision means displays said auxiliary battery needs replacing when the depth of discharge of said auxiliary battery exceeds a reference depth of discharge.

8. The auxiliary battery life determining device according to claim 1, wherein said decision means displays the amount of power remaining in said auxiliary battery.

9. The auxiliary battery life determining device according to claim 6, wherein said decision means refers to discharge curves of different depths of discharge, then calculates the useful time of said auxiliary battery from the measured results by said measuring means, and displays the useful time of said auxiliary battery.

* * * * *

UNITED STATES PATENT AND TRADEMARK OFFICE
CERTIFICATE OF CORRECTION

| | |
|---|---|
| PATENT NO. | : 6,642,719 B1 |
| DATED | : November 4, 2004 |
| INVENTOR(S) | : Hitoshi Seto |

Page 1 of 1

It is certified that error appears in the above-identified patent and that said Letters Patent is hereby corrected as shown below:

<u>Column 6,</u>
Line 44, please change "claim 1" to -- claim 6 --.

Signed and Sealed this

Seventh Day of December, 2004

JON W. DUDAS
*Director of the United States Patent and Trademark Office*